United States Patent [19]

De Luca et al.

[11] Patent Number: 4,649,236

[45] Date of Patent: Mar. 10, 1987

[54] DIGITAL SYSTEM CONNECT FRAME

[75] Inventors: Paul V. De Luca, Plandome Manor; Albert Atun, Valley Stream; Michael Shatzkin, Baldwin, all of N.Y.

[73] Assignee: Porta Systems Corp., Syosset, N.Y.

[21] Appl. No.: 812,632

[22] Filed: Dec. 23, 1985

[51] Int. Cl.[4] .............................................. H05K 7/16
[52] U.S. Cl. ...................................... 379/327; 379/19
[58] Field of Search .......................................... 179/98

[56] References Cited

U.S. PATENT DOCUMENTS

| | | | |
|---|---|---|---|
| 4,117,273 | 9/1978 | Gautier et al. | 179/98 |
| 4,160,880 | 7/1979 | Brey | 179/98 |
| 4,536,052 | 8/1985 | Baker et al. | 179/98 |

OTHER PUBLICATIONS

Switchcraft, Inc. circular #NPB 375, DSX Jackfield (1985).

Primary Examiner—Gene Z. Rubinson
Assistant Examiner—David R. Schuster
Attorney, Agent, or Firm—Charles E. Temko

[57] ABSTRACT

A modular, high density cross-connect frame specifically adapted for central office application and forming a centralized distributing frame intended for patch and cross-connect circuits for digital equipment. The frame is dual sided, with the patching and testing administration entirely on one side confined to an area readily manually and visually accessible to service personnel, with cross-connect administration confined to the opposite side.

2 Claims, 4 Drawing Figures

DIGITAL SYSTEM CONNECT FRAME

BACKGROUND OF THE INVENTION

This invention relates generally to the field of telephony, and more particularly to an improved frame construction used in a telephone office for interconnecting individual subscriber pairs to office switching systems.

Over the last decade, old style mechanical switching systems have been replaced with solid state digital switching systems, which offer many advantages, and, of course, substantially all new installations are made on a digital switching system basis. With such installation, there has arisen a need to enable the testing and checking of such systems for proper function, which was not necessary in the case of mechanical switching systems where malfunctions could be manually observed by service personnel without making conductivity tests. While testing of an individual subscriber circuit can be done by placing test currents on the subscriber line using switching equipment, or by resort to test fields on connector blocks or available at the ends of protector modules, the testing of the circuits themselves has not been as readily available. Thus, when a malfunction occurs, which cannot be traced to a subscriber line, and which is believed to lie in the plant equipment area, access to such switching equipment for test purposes has not been easy, and the ability to connect other switching equipment in line pending repair has not been facilitated.

As a result of such difficulty, there has been developed, a variety of connector blocks including jackfields which may be interconnected using patch cords, whereby circuitry may be rerouted between inside plant and outside cables with a minimum of difficulty. These structures are useful not only for effecting digital switch cutover, but also permit, for example, the rerouting of traffic interrupted by a cut cable which can be reconnected through a third office by simple cross connections.

While such jackfield elements can be installed on almost any known main frame construction, as usual, the principal problem is that of maximum space utilization. Unfortunately, because of the large number of jack outlets, and their relatively larger size as contrasted with a wire wrap pin, the effective circuit density per unit area nowhere approaches the high density possible with modern circuit block construction. If, therefore, it is desired to have a group of subscriber circuits interfaced with particular office equipment, and have all of the interconnections on a single main frame, it is apparent that conventional architecture relative to the location of the interconnecting elements be modified. Most main frames, assuming usual building limitations, are about twelve feet high, as a result of which the upper areas are not readily accessible to service personnel without the assistance of a short ladder or a similar device. On the other hand, in the case of a frame, the function of which is to provide manually made cross connections, using state-of-the art jackfield blocks, the jackfields need occupy less than forty percent of the total available area on the frame, preferably at one location, and readily accessible to service personnel without the need of resorting to a ladder or similar device.

SUMMARY OF THE INVENTION

Briefly stated, the invention contemplates the provision of an improved cross-connect telephone frame particularly suited for interconnecting digital switching systems, in which the above described criterion has been implemented. To this end, the jackfields are confined to one side of a two-sided frame, utilizing the entire width of said one side, up to a height of slightly over six feet, utilizing the remaining space on that side, and the total space on the opposite side for connector blocks which require substantially no manual access after installation. To facilitate interconnection, the side mounting the jackfield elements are provided with upper and lower horizontal troughs which communicate with smaller vertical troughs serving the jackfield elements. The opposite side includes horizontal troughs at corresponding levels, and a main vertical trough communicating with the horizontal troughs. Thus, incoming outside cable is confined to the upper portion of the frame which is not normally accessed after installation. Inside plant cable can be positioned at levels corresponding to the jackfields, and on the opposite side of the frame therefrom. As a result, all circuits are available at levels which are readily manually and visually accessible to service personnel without difficulty. In the course of this arrangement, no part of the total area on each side of the frame is without some utility, either for the mounting of blocks or jackfields, or for the provision of readily accessible cable troughs.

BRIEF DESCRIPTION OF THE DRAWING

In the drawing, to which reference will be made in the specification, similar reference characters have been employed to designate corresponding parts throughout the several views.

DETAILED DESCRIPTION OF THE DISCLOSED EMBODIMENT

Figure 1:
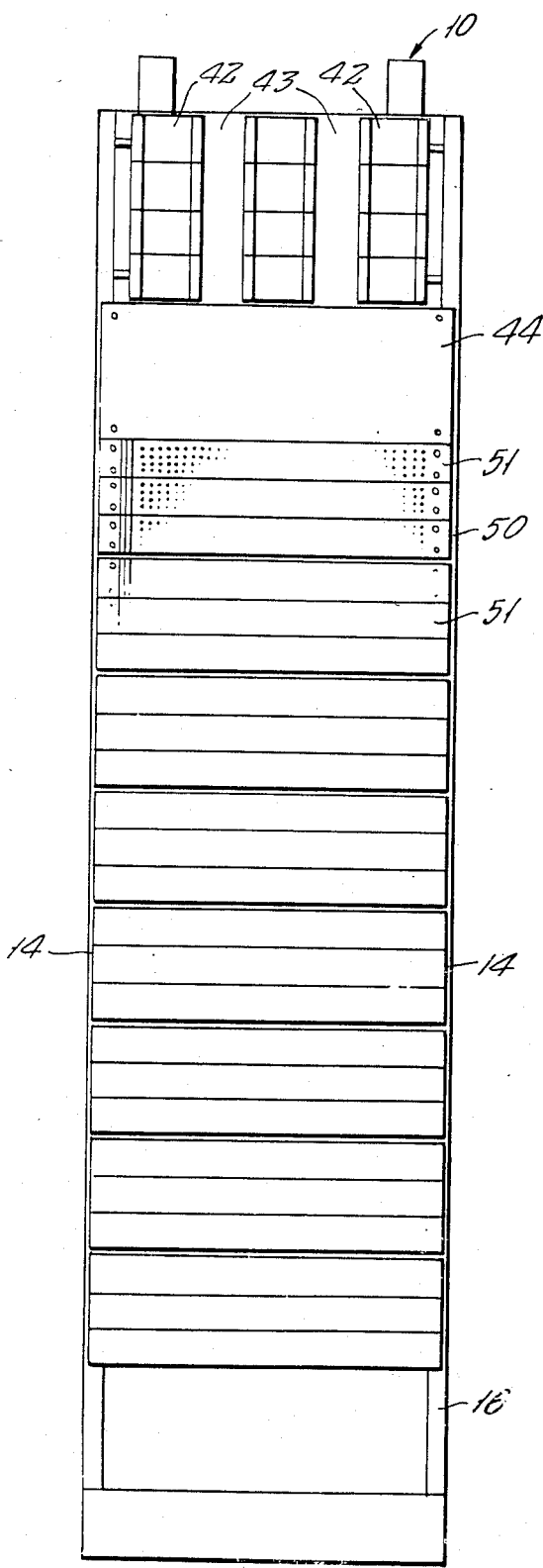
FIG. 1 is a front elevational view of an embodiment of the invention.
Figure 2:
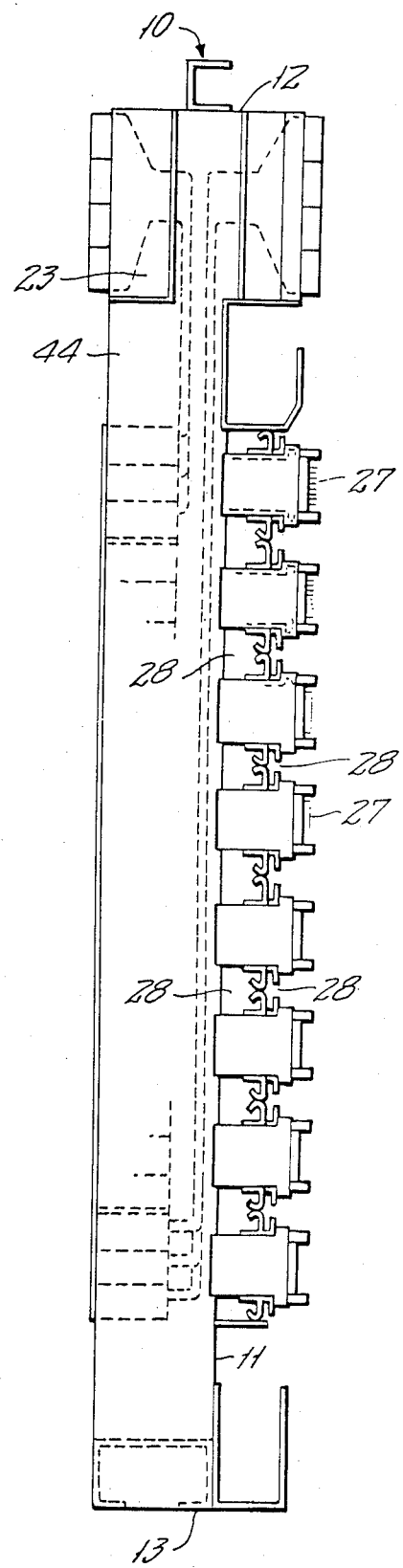
FIG. 2 is a side elevational view of thereof.

In accordance with the invention, the device, generally indicated by reference character 10, includes a main frame element 11 of generally conventional metallic construction bordered by an upper edge surface 12, a lower edge surface 13, a pair of end edge surfaces 14, and defining first and second side surfaces 15 and 16, respectively, upon which equipment is mounted. While the frame element may be of any desired height and width, assuming normal telephone office space limitations, a typical frame element will be approximately eight feet high, and five feet wide, with a thickness of six to eight inches.

Figure 3:
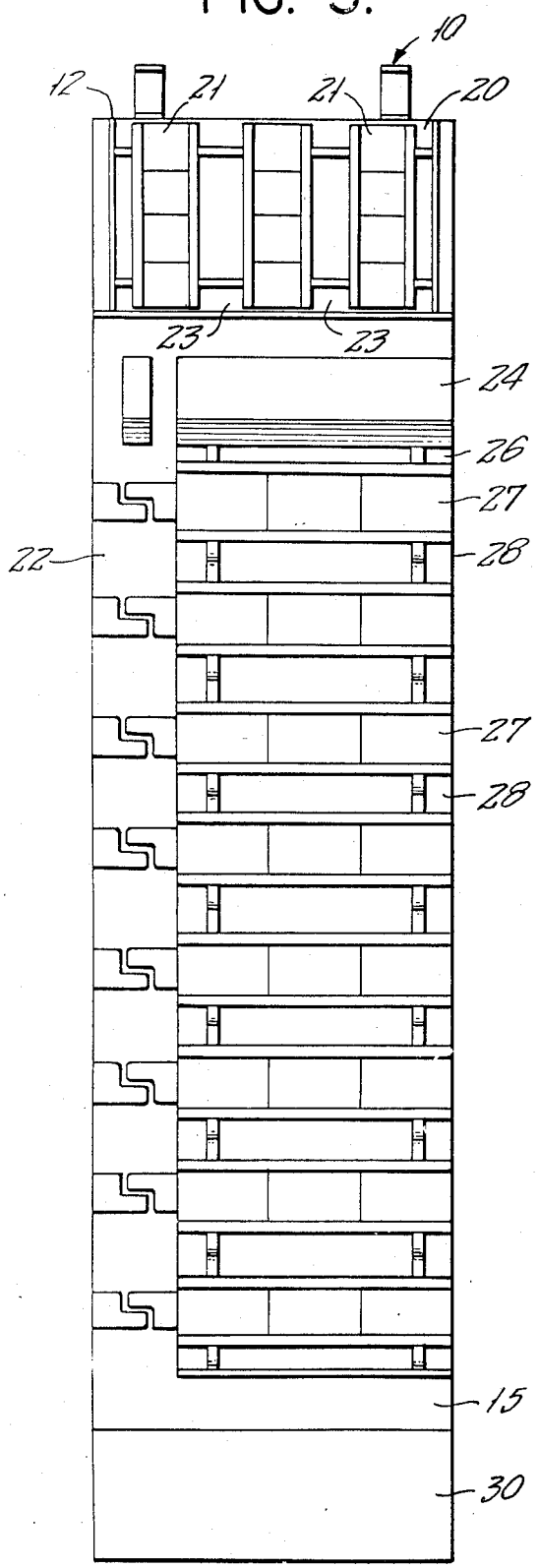
FIG. 3 is a rear elevational view thereof.
Figure 4:
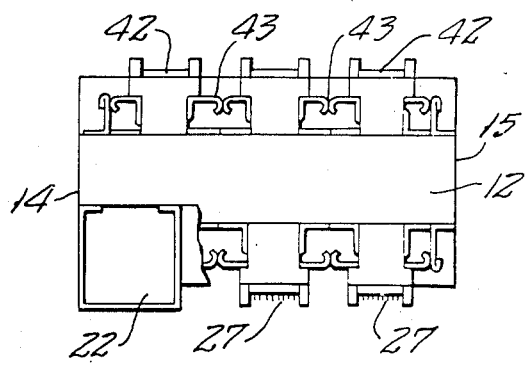
FIG. 4 is a top plan view.

Referring to FIG. 3, the side surface 15 includes an upper horizontally or laterally extending area 20 mounting a plurality of connector blocks 21 which are serviced by vertical trough-forming areas 22 and horizontal trough-forming areas 23. The blocks 21 will normally be interconnected with outside plant subscriber pairs in known fashion.

Beneath the area 20 is a lower transversely extending area 26 mounting connector blocks 27, and serviced by horizontal trough-forming areas 28, upper and lower horizontal troughs 29 and 30 and the above mentioned vertical trough-forming areas 22. The blocks 27 will normally be interconnected with inside plant equipment, and are normally of a lower density from the standpoint of accommodating cable pairs than the blocks 21.

Referring to FIG. 1, the second side 16 includes a third laterally extending area 41 of configuration and function corresponding to that of the upper area 20, and provided with corresponding blocks 42, vertical trough-forming means 43, and horizontal trough-forming means 44. Again, the blocks 42 will accommodate the remaining subscriber pairs from outside plant cables.

A fourth transversely extending area 50 is positioned opposite the area 26, and mounts juxtaposed jackfield elements 51, of known type, for example, those sold under the trademark SWITCHCRAFT No. NPB375, and available from Switchcraft, Inc. of Chicago, Illinois. The jacks are connected with any of the blocks 21, 27, and 42, depending upon their intended function, and are, in turn, interconnected with each other using conventional patch cords (not shown).

As best seen in FIG. 1, the area 50 extends approximately three-quarters of the entire height of the frame element, so that the uppermost jackfield 51 is approximately six feet above the surface of the floor, and thus readily accessible, both manually and visually to service personnel without difficulty. By placing the jackfields on only one side of the frame, the opposite side may be positioned in a less accessible location without any loss of convenience.

It may thus be seen that we have invented novel and highly useful improvements in digital system cross-connect frames for telephone usage. As contrasted with prior art arrangements, in which the jackfields are separately mounted on individual frames with cable communication to adjacent main frames, it is now possible to arrange for the convenient cross-connection of as many as 1,400 individual subscriber circuits on a single frame, without interconnecting other frames. These circuits are provided with a central cross-connect point which can be accessed for monitoring, testing and rerouting, as needed, using relatively short patch cords.

We wish it to be understood that we do not consider the invention limited to the precise details of structure shown and set forth in this specification, for obvious modifications will occur to those skilled in the art to which the invention pertains.

We claim:

1. An improved telephone frame for cross connecting digital switching systems to provide central cross connect points comprising: a vertically oriented base frame element including first and second sides for the mounting of connecting elements; said first side defining an upper transversely extending area, said area having a plurality of first connector blocks mounted thereon in juxtaposed relation, and vertical and horizontal trough-forming means adjacent said connector blocks for receiving outside plant cables connected with said first connector blocks; said first side defining a lower transversely extending area disposed beneath said upper area, said lower area having a second plurality of connector blocks thereon, and vertical and horizontal trough-forming means for receiving inside plant cables connected with said second plurality of connector blocks; said second side of said base frame element defining a third upper transversely extending area corresponding to and oppositely disposed to said first transversely extending area, and having a third plurality of connector blocks thereon in juxtaposed relation, and vertical and horizontal trough-forming means for receiving outside plant cables connected to said third plurality of connector blocks; said second side defining a fourth lower transversely extending area opposite said second lower transversely extending area of said first side of said base frame element, and having a plurality of connector blocks forming jackfields, the individual jacks of which are connected to a connector block communicating with either outside plant or inside plant cables; whereby upon installation, said frame may be completely administered from said second side utilizing access to said jackfields at vertical levels corresponding to said fourth transversely extending area.

2. An improved telephone frame in accordance with claim 1, further characterized in said fourth transversely extending area extends to a vertical height of approximately three-quarters of the total height of said frame.

* * * * *